(12) United States Patent
Akiyama

(10) Patent No.: US 9,595,948 B2
(45) Date of Patent: Mar. 14, 2017

(54) SEMICONDUCTOR DEVICE HAVING A DOUBLE-GATE SWITCHING ELEMENT

(71) Applicant: DENSO CORPORATION, Kariya, Aichi-pref. (JP)

(72) Inventor: Hironori Akiyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/163,778

(22) Filed: May 25, 2016

(65) Prior Publication Data

US 2017/0026034 A1 Jan. 26, 2017

(30) Foreign Application Priority Data

Jul. 20, 2015 (JP) ................................. 2015-143539

(51) Int. Cl.
   *H03K 3/00* (2006.01)
   *H03K 17/04* (2006.01)
   *H03K 17/28* (2006.01)

(52) U.S. Cl.
   CPC ......... *H03K 17/0406* (2013.01); *H03K 17/28* (2013.01)

(58) Field of Classification Search
   CPC ............................ H03K 17/0406; H03K 17/28
   See application file for complete search history.

(56) References Cited

U.S. PATENT DOCUMENTS

| 8,735,989 B2* | 5/2014 | Matsushita | ......... H01L 29/7397 257/370 |
| 2010/0156506 A1* | 6/2010 | Tsuzuki | ............... H01L 27/0664 327/478 |
| 2010/0187567 A1* | 7/2010 | Tanabe | ................ H01L 29/0615 257/140 |
| 2010/0283514 A1* | 11/2010 | Soeno | ................. H01L 29/0834 327/109 |
| 2011/0074485 A1* | 3/2011 | Yamamoto | ........... H03K 17/168 327/333 |
| 2011/0285427 A1* | 11/2011 | Koyama | .............. H01L 29/7391 327/109 |
| 2012/0280728 A1 | 11/2012 | Hussein et al. | |
| 2014/0184303 A1 | 7/2014 | Hasegawa et al. | |
| 2014/0209972 A1 | 7/2014 | Sumitomo et al. | |

FOREIGN PATENT DOCUMENTS

| JP | H09-285120 A | 10/1997 |
| JP | 2003-158269 A | 5/2003 |
| JP | 2010-251517 A | 11/2010 |
| JP | 2014-135897 A | 7/2014 |

* cited by examiner

*Primary Examiner* — Kenneth B Wells

(57) ABSTRACT

A semiconductor device has a drive unit outputting a first drive signal to a first electrode and a second drive signal to a second electrode, an instruction signal generation unit generating an instruction signal as a basis of the drive signals and a control unit outputting a first control signal as a basis of the first drive signal and a second control signal as a basis of the second drive signal, based on the instruction signal to control the drive unit. The control unit synchronizes the first control signal with the instruction signal, delays a turning-on timing of the second control signal by a predetermined time relative to the instruction signal and determines a turning-off timing of the second control signal based on a previous pulse width of the instruction signal.

11 Claims, 2 Drawing Sheets

SEMICONDUCTOR DEVICE HAVING A DOUBLE-GATE SWITCHING ELEMENT

CROSS REFERENCE TO RELATED APPLICATION

This application is based on reference Japanese Patent Application No. 2015-143539 filed on Jul. 20, 2015, the disclosure of which is incorporated herein by reference.

TECHNICAL FIELD

The present disclosure relates to a semiconductor device.

BACKGROUND

In prior semiconductor devices, there may be a double-gate switching element having two independent gate electrodes integrally. Patent Document 1 discloses a semiconductor device having a certain gate electrode and a remaining gate electrode. The semiconductor device may be configured to turn off the certain gate electrode after turning off the remaining gate electrode. In this structure, the remaining gate electrode may be turned off beforehand, to turn off the certain gate electrode after a part of carriers has been drawn out. Thus, a period of drawing out all carriers may decrease to increase turning-off speed.

A turning-off timing, at which the certain gate electrode is turned off afterwards, may be determined by setting a predetermined delay on a basis of a turning-off timing, at which the remaining gate electrode is turned off beforehand. In other words, a turning-on timing and the turning-off timing of the remaining gate electrode may be synchronized with a turning-on timing and a turning-off timing of an instruction signal, which controls a voltage applied to the gate electrodes. On the other hand, the certain gate electrode may need to be turned off after a predetermined period subsequent to the turning-off timing of the instruction signal.

In such a structure, a turning-on period of the certain gate electrode may be longer than a turning-on period regulated by the instruction signal. Thus, a duty ratio of the switching element as a whole may be longer than a duty ratio regulated by the instruction signal.

A turning-on timing of the certain gate electrode turned off afterwards may be delayed by the same time as a delay in the turning-off timing thereof. In such a structure, the turning-on timing and the turning-off timing of the switching element may be wholly delayed relative to the instruction signal.

Patent Document 1

Publication of unexamined Japanese patent application No. 2013-98415

SUMMARY

It is an object of the present disclosure to produce a semiconductor device having a configuration to increase switching speed without modification of a duty ratio relative to an instruction signal and without a delay in a turning-on timing and a turning-off timing of a switching element.

According to an aspect of the present disclosure, a semiconductor device drives a control electrode, which includes a first electrode and a second electrode in parallel, to control turning-on and turning-off of a switching element. The semiconductor device has a drive unit, an instruction signal generation unit, and a control unit. The drive unit outputs a first drive signal to the first electrode and a second drive signal to the second electrode, to drive turning-on and turning-off of the switching element. The instruction signal generation unit generates an instruction signal as a basis of the drive signals. The control unit outputs a first control signal as a basis of the first drive signal and a second control signal as a basis of the second drive signal, based on the instruction signal to control the drive unit. The control unit synchronizes the first control signal with the instruction signal, delays a turning-on timing of the second control signal by a predetermined time relative to the instruction signal and determines a turning-off timing of the second control signal based on a previous pulse width of the instruction signal.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

As follows, embodiments of the present disclosure will be described in detail.

EMBODIMENT

First Embodiment

Configuration of a semiconductor device according to the first embodiment will be described with reference to FIG. 1 and FIG. 2.

The semiconductor device 100 according to the first embodiment is a drive device to drive a double-gate Insulated Gate Bipolar Transistor, which is an IGBT 200 as a switching element. The IGBT 200 has two independent gate electrodes 211, 212 as a control electrode 210. The switching element is not limited to the IGBT 200 and may be a MOSFET.

Figure 1:
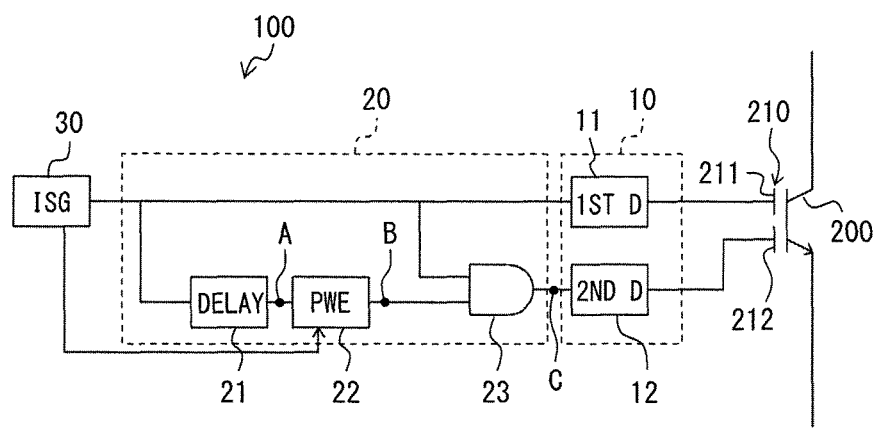
FIG. 1 is a block diagram showing a semiconductor device and peripheral circuits according to the first embodiment.
Figure 2:
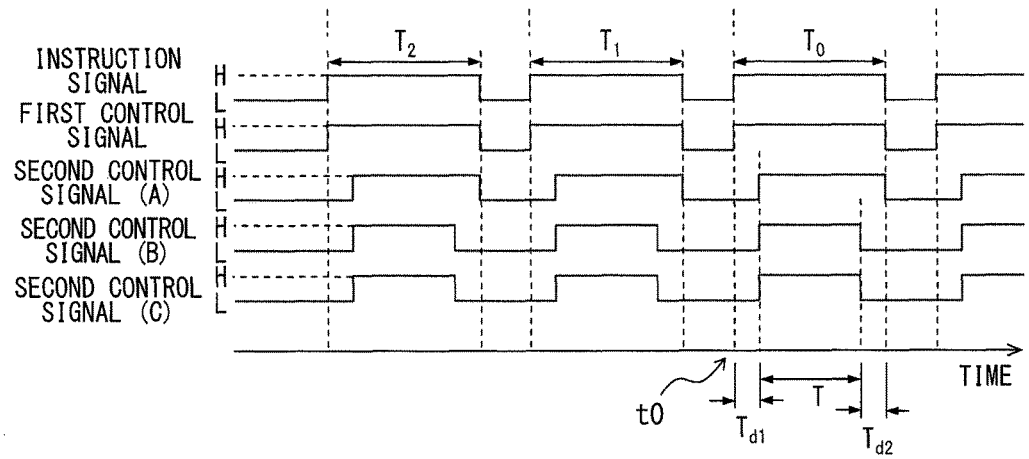
FIG. 2 is a timing chart showing control signals of a control unit.

Refer to FIG. 1, the semiconductor device 100 has a drive unit 10, a control unit 20 and an instruction signal generation unit 30. The drive unit 10 is connected to the control electrode 210 of the IGBT 200. This IGBT 200 is a subject to drive.

The control electrode 210 includes a first electrode 211 and a second electrode 212. The switching element forms the two independent electrodes 211, 212 integrally within the IGBT 200. When the switching element is turned on, the second electrode 212 is turned on at a different timing from a timing at which the first electrode 211 is turned on. As a result, when the switching element is turned on, an output current of the switch element is reduced to avoid breakdown of the switching element due to overcurrent generated by a short circuit. On the other hand, when the switching element is turned off, the second electrode 212 is turned off at a different timing from a timing at which the first electrode 211 is turned off. In other words, a voltage release timing of the second electrode 212 is different from a voltage release timing of the first electrode 211. As a result, when the switching element is turned off, a period of drawing out carriers decreases to increase turning-off speed.

The drive unit 10 includes a first drive unit 11 and a second drive unit 12. The first drive unit 11 applies a first gate voltage to the first electrode 211. The second drive unit 12 applies a second gate voltage to the second electrode 212. Applying the first gate voltage to the first electrode 211 by the first drive unit 11 is independent from applying the second gate voltage to the second electrode 212 by the second drive unit 12. The drive unit 10 is configured to control two conditions of the gate voltage, which are a high condition and a low condition, based on an instruction signal. In other words, the drive unit 10 is configured to control turning-on and turning-off of the IGBT 200. The first gate voltage applied to the first electrode 211 is defined as a first drive signal. The second gate voltage applied to the second electrode 212 is defined as a second drive signal.

The control unit 20 is configured to control the drive unit 10 based on the instruction signal inputted thereto. Specifically, the control unit 20 is configured to generate a first control signal outputted to the first drive unit 11 and a second control signal outputted to the second drive unit 12.

The instruction signal generation unit 30 is configured to generate the instruction signal to instruct a timing for applying the gate voltage to the drive unit 10 via the control unit 20. The instruction signal has a high condition and a low condition. When the instruction signal inputted to the drive unit 10 is in the high condition, the drive unit 10 applies the gate voltage to the control electrode 210. On the other hand, when the instruction signal inputted to the drive unit 10 is in the low condition, the drive unit 10 stops applying the gate voltage to the control electrode 210. Thus, when the instruction signal is in the high condition, the drive signal related to the gate voltage is in high condition. In such a condition, the gate voltage is in an applying condition. On the other hand, when the instruction signal is in the low condition, the drive signal is in low condition. In such a condition, the gate voltage is in a stopping condition.

The control unit 20 has a delay unit 21, a pulse width estimation unit 22 and an operation unit 23. Refer to FIG. 1, the instruction signal is inputted to the control unit 20. After that, the instruction signal diverges into the first drive unit 11, the delay unit 21 and the operation unit 23.

The instruction signal diverging into the first drive unit 11 is outputted from the control unit 20 as a first control signal without any modification thereby. In other words, the control unit 20 outputs the original instruction signal as the first control signal without changing phases. In further other words, the first control signal is synchronized with the instruction signal refer to FIG. 2. As a result, a turning-on timing and a turning-off timing of the first control signal are synchronized with a turning-on timing and a turning-off timing of the instruction signal.

On the other hand, the instruction signal diverging into the delay unit 21 is inputted thereto, and outputted to the operation unit 23 via the pulse width estimation unit 22 as a second control signal.

The delay unit 21 delays a turning-on timing of the second control signal. The turning-on timing is a timing for changing conditions of the second control signal from a low condition to a high condition relative to the turning-on timing of the instruction signal. The second control signal outputted from the delay unit 21 is indicated with the dot A in FIG. 1. Refer to FIG. 2, the turning-on timing of the second control signal outputted from the delay unit 21 is delayed by the period Td1 relative to the instruction signal, which is generated by the instruction signal generation unit 30.

The turning-on timing of the second control signal, which is inputted to the pulse width estimation unit 22, is delayed by a period Td1. The pulse width estimation unit 22 is connected to the instruction signal generation unit 30 to enable communication. The pulse width estimation unit 22 inputs pulse width information of the instruction signal. The pulse width estimation unit 22 has a memory. When present time is time t0 indicated in FIG. 2, the memory of the pulse width estimation unit 22 memorizes past pulse widths T1, T2 and further past pulse width Ti as the pulse width information.

The pulse width estimation unit 22 determines a high condition period after the period Td1 from the time t0 according to the first formula. The high condition period is a pulse width T of the second control signal. In other words, the pulse width estimation unit 22 determines the turning-off timing of the second control signal. The first formula has the period Td1, a period Td2 and a previous pulse width Tpre.

$$T = Tpre - (Td1 - Td2)$$ [The first formula]

The period Td1 is a delay in the turning-on timing of the second control signal, which is predetermined in advance. The period Td2 is an advance in the turning-off timing of the second control signal, which is predetermined in advance. The turning-off timing of the second control signal is earlier almost by the period Td2 than that of the instruction signal. In other words, the turning-off timing of the second control signal is earlier almost by the period Td2 than that of the first control signal.

The previous pulse width Tpre of the instruction signal is calculated with a statistic value of the past pulse widths Ti (i=1, 2, 3 . . . ) of the instruction signal. The statistic value is a value, such as an average value or a median value. In the first embodiment, the previous pulse width Tpre is calculated according to the second formula. The second formula indicates that the previous pulse width Tpre is the average value of the past pulse widths Ti (i=1, 2, 3 . . . , N) from i cycle until N cycle before the time to. When N is equal to 1, the previous pulse width Tpre is the past pulse width T1, which is just one cycle ago. In this condition, the pulse width estimation unit 22 estimates that the present pulse width T0 of the instruction signal is the substantially same as the past pulse width T1.

$$Tpre = \frac{1}{N}\sum_{i=1}^{N} Ti$$ [The second formula]

The second control signal outputted from the pulse width estimation unit 22 is indicated with the dot B in FIG. 1. Refer to FIG. 2, when the period Td1 passes from the time t0, the second control signal changes the conditions from the low condition to the high condition. After changing the conditions, the second control signal keeps the high condition during the pulse width T, which is calculated with the first formula. After keeping the high condition, the second control signal changes the conditions from the high condition to the low condition. The turning-off timing of the second control signal comes after the period Td1+T from the time t0.

The pulse width of the instruction signal depends on states of the IGBT 200 and a load. Therefore, the pulse width of the instruction signal may be variable. In other words, the period Td1+T+Td2 may not correspond to the present pulse width T0. When the past pulse width Ti is a fixed value, the period Td1+T+Td2 can correspond to the present pulse width T0. Especially, under such a PWM control, the pulse width of the instruction signal hardly changes. Thus, refer to FIG. 2, the turning-off timing of the second control signal outputted from the pulse width estimation unit 22 is earlier almost by the period Td2 than that of the first control signal.

The second control signal, which is outputted from the pulse width estimation unit 22, inputs to the operation unit 23. The operation unit 23 is configured to operate a logical AND between the instruction signal diverging into the operation unit 23 and the second control signal inputted thereto.

On the other hand, when the turning-off timing of the second control signal outputted from the pulse width estimation unit 22 is earlier than that of the instruction signal, the instruction signal is in the high condition as long as the second control signal is in the high condition. The second control signal outputted from the operation unit 23 is indicated with the dot C in FIG. 1. Thus, refer to FIG. 2, the control signal outputted from the operation unit 23 is the same as the control signal outputted from the pulse width estimation unit 22, which is indicated with the dot B in FIG. 1.

When a duty ratio of the instruction signal is regulated as a large value and the period Td2 is regulated as a small value, the present pulse width T0 may be bigger than the period T+Td1. In this condition, the turning-off timing of the second control signal outputted from the pulse width estimation unit 22 is later than that of the instruction signal. Even if in this condition, the operation unit 23 is configured to operate the logical AND between the instruction signal and the second control signal so that the turning-off timing of the second control signal outputted from the operation unit 23 is never later than that of the instruction signal.

The second control signal outputted from the operation unit 23 is inputted to the second drive unit 12. The second drive unit 12 creates the second drive signal and outputs to the second electrode 212. The second drive signal is synchronized with the second control signal outputted from the operation unit 23. Therefore, a turning-on timing of the second drive signal is delayed in the period Td1. A turning-off timing of the second drive signal is advanced in the period Td2. Even if the period Td2 is not constant, the operation unit 23 provides that the turning-off timing of the second drive signal is never later than that of the instruction signal.

One effect of the semiconductor device 100 according to the first embodiment will be described.

The turning-off timing of the second drive signal is determined based on the previous pulse width Tpre to control turning-off of the second electrode 212 without depending on the present pulse width T0 of the instruction signal.

Especially, the control unit 20 has the delay unit 21, the pulse width estimation unit 22 and the operation unit 23 so that the turning-on timing of the second drive signal is delayed in the period Td1 and the turning-off timing of the second drive signal is advanced in the period Td2. Therefore, a pulse width of the second drive signal is never longer than that of the first drive signal. In other words, a duty ratio of the second drive signal is never longer than that of the first drive signal so that the first electrode 211 is turned off after the second electrode 212 is turned off to increase switching speed without modification of the duty ratio relative to the instruction signal. The turning-off timing of the second drive signal is either the same as that of the first drive signal or earlier than that of the first drive signal, to avoid that a duty ratio of the switching element as a whole is larger than the duty ratio regulated by the instruction signal.

Alternative Embodiment

In the above example, the previous pulse width Tpre of the instruction signal is calculated with the statistic value of the past pulse widths Ti (i=1, 2, 3 . . . ) of the instruction signal with according to the second formula. The formula for calculating the previous pulse width Tpre is not limited to the second formula and may be the third formula. The third formula is a formula to correct the average values of the difference between adjacent past pulse widths each other, based on the perturbation theory as a basis of the past pulse width T1, which is just one cycle ago.

$$Tpre = Ti + \frac{1}{N-1}\sum_{i=1}^{N-1}(Ti - Ti + 1) \qquad \text{[The third formula]}$$

When the instruction signal generation unit 30 determines several future pulse widths in advance, these future pulse widths may be used as the previous pulse width Tpre of the first formula without using the second formula or the third formula.

Second Embodiment

In the above examples, the period Td1 and the period Td2 are constant. In the second embodiment, the period Td2 can be variable.

Figure 3:
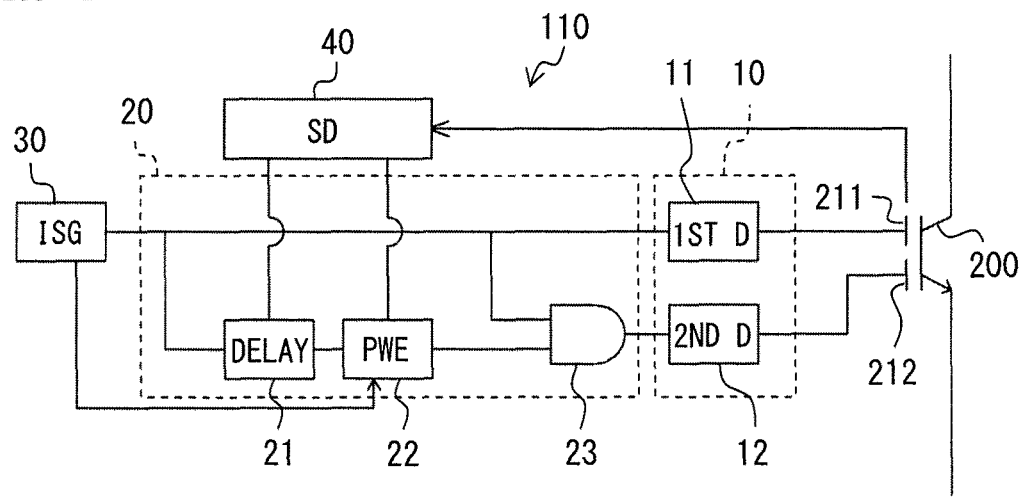
FIG. 3 is a block diagram showing a semiconductor device and peripheral circuits according to the second embodiment.

Refer to FIG. 3, the semiconductor device 110 according to the second embodiment has a state detection unit 40 in addition to the semiconductor device 100 according to the first embodiment. The state detection unit 40 has a thermometer located near the IGBT 200. The thermometer is, for example, a PN-junction semiconductor thermometer.

The state detection unit 40 has further a current detector, which detects a collector current outputted from the IGBT 200. For example, the current detector has a shunt resistor, which is located in a sense cell of the IGBT 200, to calculate the collector current with one end voltage and the other end voltage of the shunt resistor.

Refer to FIG. 3, the state detection unit 40 is connected to the delay unit 21 and the pulse width estimation unit 22 to enable communication. The state detection unit 40 feeds back a temperature of the IGBT 200 detected by the thermometer or/and the collector current of the IGBT 200 detected by the current detector to determine the period Td2.

When the temperature of the IGBT 200 is low, the state detection unit 40 instructs to the pulse width estimation unit 22 that the period Td2 is to be reduced.

When the collector current of the IGBT 200 is low, the state detection unit 40 instructs to the pulse width estimation unit 22 that the period Td2 is to be reduced.

This reduction of the period Td2 can decrease conduction loss due to increasing ON resistance. The first electrode 211 maintains turning-on of the IGBT 200 without the second electrode 212 until completely turning-off of the IGBT 200. When the period Td2 is regulated as a larger value, the first electrode 211 has to maintain turning-on of the IGBT 200 for a longer time. As a result, the ON resistance increases so that the conduction loss increases. Therefore, it is preferable to reduce the period Td2 as much as possible.

The IGBT 200 is made from silicon. When the temperature of the IGBT is low, for example, lattice vibration of silicon becomes small. Thereby, carrier moving speed becomes faster so that the IGBT 200 can be turned off quickly. Thus, the period Td2 decreases as the temperature of the IGBT 200 is low.

On the other hand, when the output current of the IGBT 200 is low, a total carrier volume becomes smaller so that a carrier drawing time can be shorter. Thus, the period Td2 decreases as the collector current of the IGBT 200 is low.

Relationships between the temperature and the period Td2, and between the output current and the period Td2 depend on a configuration and a condition of the IGBT 200. When the relationships are reversed in the above example, the period Td2 should be determined appropriately based on the configuration and the condition of the IGBT 200.

Third Embodiment

In the above examples, the first electrode 211 and the second electrode 212 are formed integrally within the IGBT 200. This IGBT 200 is the switching element as a sole element.

Figure 4:
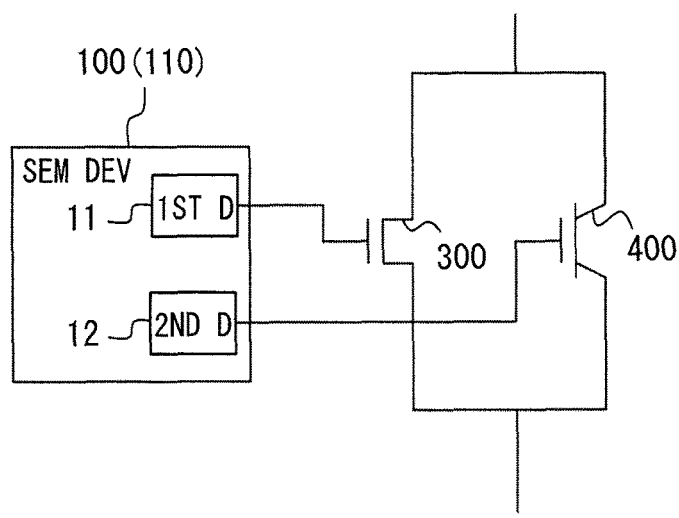
FIG. 4 is a block diagram showing a semiconductor device and peripheral circuits according to the third embodiment.

In the third embodiment, the switching element includes a first element, which is a MOSFET 300, and a second element, which is a IGBT 400. The first element and the second element are connected in parallel to the drive unit 10. The control electrode includes a first electrode formed in the MOSFET 300 and a second electrode formed in the IGBT 400. The first drive unit 11 is connected to the first electrode of the MOSFET 300. The second drive unit 12 is connected to the second electrode of the IGBT 400. Refer to FIG. 4, even if the switching element has the MOSFET 300 and the IGBT 400 in parallel, the semiconductor device 100 or 110 can be installed to control turning-on and turning-off of the switching element.

Recently, silicon carbide, which is SiC, has been used as a material of the switching element. The silicon carbide is one of the wide band gap semiconductors. The switching element, which is comprised mainly of the silicon carbide, has the lower ON resistance than that of the switching element, which is comprised mainly of the silicon. The lower ON resistance provides reduction of the conduction loss. Thus, the silicon carbide is preferable to reduce not only a volume of a tail current, which occurs in turning-off of the IGBT 400, but also the conduction loss.

In such a structure, the turning-off timing of the IGBT 400 is regulated to be earlier than that of the MOSFET 300. In other words, the IGBT 400 is needed to be turned off beforehand than the turning-off timing of the MOSFET 300. Therefore, installing the semiconductor device 100 or 110 to such a drive device, which has the MOSFET 300 and the IGBT 400, is preferable so that the second electrode 212 can be turned off beforehand than the turning-off timing of the first electrode 211 without modification of the duty ratio relative to the instruction signal. As a result, a turning-on period of the IGBT 400 is never longer than that of the MOSFET 300 to avoid that the turning-on timing and the turning-off timing of the switching element as a whole is delayed relative to the instruction signal.

OTHER EMBODIMENTS

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

In the above examples, the pulse width estimation unit 22 is behind the delay unit 21 relative to the second control signal. The delay unit 21 may be behind the pulse width estimation unit 22.

The switching element is not limited to the IGBT or the MOSFET and may be alternatively a bipolar transistor. The bipolar transistor may have a base electrode as the control electrode.

In the above examples, two electrodes are connected to the drive unit 10. The number of the electrodes is not limited to two and may be alternatively more than three.

In the above examples, the turning-on timing of the second control signal is delayed in the period Td1, which is not limited and the period Td1 may be zero. In other words, the turning-on timing of the second control signal may be the same as that of the instruction signal.

The state detection unit 40 may feed back the detected states to determine not only the period Td2 but also the period Td1.

According to the present disclosure, the semiconductor device drives the control electrode, which includes the first electrode and the second electrode in parallel, to control turning-on and turning-off of the switching element. This semiconductor device has the drive unit, the instruction signal generation unit and the control unit. The drive unit outputs the first drive signal to the first electrode and the second drive signal to the second electrode, to drive turning-on and turning-off of the switching element. The instruction signal generation unit generates the instruction signal as a basis of the drive signals. The control unit outputs the first control signal as a basis of the first drive signal and the second control signal as a basis of the second drive signal, based on the instruction signal to control the drive unit. The control unit synchronizes the first control signal with the instruction signal, delays the turning-on timing of the second control signal by the predetermined time relative to the instruction signal and determines the turning-off timing of the second control signal based on the previous pulse width of the instruction signal.

With the present configuration, the turning-off timing of the second drive signal is determined based on the previous pulse width, to enable to control turning-off of the second electrode without depending on the present pulse width of the instruction signal.

According to the present disclosure, the control unit includes the delay unit, the pulse width estimation unit and the operation unit. The delay unit delays the turning-on timing of the second control signal. The pulse width estimation unit determines the turning-off timing of the second control signal with measuring the previous pulse width of the instruction signal. The operation unit operates the logical AND between the instruction signal and the second control signal, which is through the delay unit and the pulse width estimation unit. The operation unit outputs the second control signal which is inputted to the drive unit. The control unit outputs the first control signal and the second control signal. The turning-on timing and the turning-off timing of the first control signal are the same as those of the instruction signal. The turning-on timing and the turning-off timing of the second control signal are different from those of the instruction signal.

With the present configuration, the pulse width of the second drive signal is never longer than that of the first drive signal. In other words, the duty ratio of the second drive signal is never longer than that of the first drive signal. Therefore, the first electrode is turned off after the second electrode is turned off to enable to increase the switching speed without the modification of the duty ratio relative to the instruction signal. The turning-off timing of the second drive signal is either the same as that of the first drive signal or earlier than that of the first drive signal, to avoid that the duty ratio of the switching element as a whole is longer than the duty ratio regulated by the instruction signal.

What is claimed is:

1. A semiconductor device for driving a control electrode, which includes a first electrode and a second electrode in parallel, to control turning-on and turning-off of a switching element, comprising:
    a drive unit for outputting a first drive signal to a first electrode and a second drive signal to a second electrode, to drive turning-on and turning-off of a switching element;
    an instruction signal generation unit for generating an instruction signal as a basis of the drive signals; and
    a control unit for outputting a first control signal as a basis of the first drive signal and a second control signal as a basis of the second drive signal, based on the instruction signal to control the drive unit; wherein
    the control unit synchronizes the first control signal with the instruction signal, delays a turning-on timing of the second control signal by a predetermined time relative to the instruction signal and determines a turning-off timing of the second control signal based on a previous pulse width of the instruction signal.

2. The semiconductor device according to claim 1, wherein the control unit includes:
    a delay unit for delaying the turning-on timing of the second control signal;
    a pulse width estimation unit for determining the turning-off timing of the second control signal with measuring the previous pulse width of the instruction signal; and
    an operation unit for operating a logical AND between the instruction signal and the second control signal, which is through the delay unit and the pulse width estimation unit, to output the second control signal which is inputted to the drive unit; wherein
    the control unit outputs the first control signal, whose turning-on timing and turning-off timing are as the same as those of the instruction signal, and the second control signal, whose turning-on timing and turning-off timing are different from those of the instruction signal.

3. The semiconductor device according to claim 1, further comprising a state detection unit for detecting a state of the switching element, wherein
    the control unit determines the turning-on timing and the turning-off timing of the second control signal, based on the previous pulse width in addition to the state of the switching element detected by the state detection unit.

4. The semiconductor device according to claim 3, wherein the state detection unit detects a temperature of the switching element,
    the control unit decreases an advance in the turning-off timing of the second control signal as the detected temperature is low.

5. The semiconductor device according to claim 3, wherein the state detection unit detects an output current outputted from the switching element,
    the control unit decreases an advance in the turning-off timing of the second control signal as the detected output current is low.

6. The semiconductor device according to claim 1, wherein the control unit calculates a pulse width of the second control signal according to the formula: T=Tpre−(Td1+Td2), which has a delay Td1 in the turning-on timing of the second control signal, an advance Td2 in the turning-off timing of the second control signal and the previous pulse width Tpre of the instruction signal.

7. The semiconductor device according to claim 1, wherein the control unit calculates the previous pulse width of the instruction signal with a statistic value of past pulse widths of the instruction signal.

8. The semiconductor device according to claim 1, wherein the control unit memorizes past pulse widths Ti from i cycle until N cycle, and calculates the previous pulse width Tpre according to the formula:

$$Tpre = \frac{1}{N}\sum_{i=1}^{N} Ti.$$

9. The semiconductor device according to claim 1, wherein the control unit memorizes past pulse widths Ti from i cycle until N cycle, and calculates the previous pulse width Tpre according to the formula:

$$Tpre = Ti + \frac{1}{N-1}\sum_{i=1}^{N-1}(Ti - Ti + 1).$$

10. The semiconductor device according to claim 1, wherein the first electrode and the second electrode are formed integrally in the switching element.

11. The semiconductor device according to claim 1, wherein the switching element includes a first element and a second element,
    the first electrode is formed in the first element and the second electrode is formed in the second element,
    the first element and the second element are connected in parallel to the drive unit.

* * * * *